(12) United States Patent
Onobu et al.

(10) Patent No.: US 9,558,790 B1
(45) Date of Patent: Jan. 31, 2017

(54) HERMETIC SEALING WITH HIGH-SPEED TRANSMISSION FOR HARD DISK DRIVE

(71) Applicant: HGST Netherlands B.V., Amsterdam (NL)

(72) Inventors: Yuta Onobu, Yokohama (JP); Takako Hayakawa, Hiratsuka (JP); Kimihiko Sudo, Yokohama (JP); Seong-Hun Choe, Fujisawa (JP); Takehito Nagata, Fujisawa (JP); Yuji Soga, Ashigarakamigun Oimachi (JP); Nobumasa Nishiyama, Yokohama (JP); Kazuhiro Nagaoka, Fujisawa (JP)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 15/080,487

(22) Filed: Mar. 24, 2016

(51) Int. Cl.
| | | |
|---|---|---|
| G11B 33/14 | (2006.01) | |
| H01R 4/48 | (2006.01) | |
| H01R 13/52 | (2006.01) | |
| H01R 4/58 | (2006.01) | |

(52) U.S. Cl.
CPC ............ G11B 33/148 (2013.01); G11B 33/14 (2013.01); H01R 4/58 (2013.01); H01R 13/521 (2013.01)

(58) Field of Classification Search
CPC .................................. G11B 33/14; H01R 4/58
USPC ................... 360/97.22; 439/88, 921, 89, 191
See application file for complete search history.

(56) References Cited

U.S. PATENT DOCUMENTS

| | | | |
|---|---|---|---|
| 6,129,579 A | 10/2000 | Cox et al. | |
| 6,332,785 B1 * | 12/2001 | Muench, Jr. | ........... H01R 13/53 439/88 |
| 6,821,145 B1 | 11/2004 | Pollock et al. | |
| 6,970,322 B2 | 11/2005 | Bernett | |
| 7,019,942 B2 | 3/2006 | Gunderson et al. | |
| 7,137,196 B2 | 11/2006 | Gunderson et al. | |
| 7,599,147 B2 | 10/2009 | Gunderson | |
| 8,098,454 B2 | 1/2012 | Kouno et al. | |
| 8,194,348 B2 | 6/2012 | Jacoby et al. | |
| 2014/0045355 A1 * | 2/2014 | Schuckmann | ......... H01R 13/44 439/271 |
| 2015/0257293 A1 | 9/2015 | Hirano et al. | |

* cited by examiner

*Primary Examiner* — Allen T Cao
(74) *Attorney, Agent, or Firm* — Patterson & Sheridan, LLP

(57) ABSTRACT

Embodiments disclosed herein generally relate to hermetic electrical connectors used in hard disk drives. The hermetic electrical connector includes a barrier structure having a first plurality of connecting pads disposed on a first surface of the barrier structure and a second plurality of connecting pads disposed on a second surface of the barrier structure opposite the first surface. A plurality of conductors is disposed within the barrier structure, and each conductor is coupled to a connecting pad of the first plurality of connecting pads and a corresponding connecting pad of the second plurality of connecting pads. The barrier structure further includes a dielectric material between the first and second surfaces, and one or more layers embedded in the dielectric material. The addition of the layers helps choke the helium gas flow, thus improving sealing of the electrical connector while maintaining high-speed electrical transmission.

20 Claims, 6 Drawing Sheets

HERMETIC SEALING WITH HIGH-SPEED TRANSMISSION FOR HARD DISK DRIVE

BACKGROUND

Field

Embodiments disclosed herein generally relate to electrical connectors for electronic devices, and more particularly to hermetic electrical connectors used in hard disk drives.

Description of the Related Art

A hard disk drive (HDD) is a non-volatile storage device that is housed in a protective enclosure and stores digitally encoded data on one or more magnetic media, such as magnetic disks. When an HDD is in operation, each magnetic disk is rapidly rotated by a spindle system. Data is read from and written to the magnetic disk using a read/write head that is positioned over a specific location of the magnetic disk by an actuator.

A read/write head uses a magnetic field to read data from and write data to the surface of the magnetic disk. Write heads make use of the electricity flowing through a coil, which produces a magnetic field. Electrical pulses are sent to the write head, with different patterns of positive and negative currents. The current in the coil of the write head induces a magnetic field across the gap between the head and the magnetic disk, which in turn magnetizes a small area on the recording disk.

There are various benefits to operating an HDD in helium ambient, because the density of helium gas is one seventh that of air. For example, operating an HDD in helium reduces the drag force acting on the spinning disk stack and the mechanical power used by the disk spindle motor. Further, operating in helium gas reduces flutter of the disks and the suspension, allowing for disks to be placed closer together and increasing the areal density by enabling a smaller, narrower data track pitch. The lower shear forces and more efficient thermal conduction of helium also mean the HDD will run cooler and will emit less acoustic noise. The reliability of the HDD is also increased due to low humidity, less sensitivity to altitude and external pressure variations, and the absence of corrosive gases or contaminants. However, known devices and methods for sealing an HDD in helium result in a marked increase in the cost of the HDD, and high-speed electrical transmission may be sacrificed in order to improve sealing of the HDD with respect to helium gas.

Therefore, there is a need in the art for an improved apparatus for sealing an HDD with helium gas inside.

SUMMARY

Embodiments disclosed herein generally relate to hermetic electrical connectors used in hard disk drives. The hermetic electrical connector includes a barrier structure having a first plurality of connecting pads disposed on a first surface of the barrier structure and a second plurality of connecting pads disposed on a second surface of the barrier structure opposite the first surface. A plurality of conductors is disposed within the barrier structure, and each conductor is coupled to a connecting pad of the first plurality of connecting pads and a corresponding connecting pad of the second plurality of connecting pads. The barrier structure further includes a dielectric material between the first and second surfaces, and one or more layers embedded in the dielectric material. The addition of the layers helps choke the helium gas flow, thus improving sealing of the electrical connector while maintaining high-speed electrical transmission.

In one embodiment, a hermetic electrical connector includes an external connector, an internal connector, and a barrier structure disposed between the external connector and the internal connector. The barrier structure includes a dielectric material (having a first surface and a second surface opposite the first surface) and one or more layers embedded in the dielectric material. The one or more layers each includes a plurality of openings. The barrier structure further includes a plurality of conductors embedded in the dielectric material. Each conductor extends through a corresponding opening of the plurality of openings of each layer.

In another embodiment, a hermetic electrical connector includes an external connector, an internal connector, and a barrier structure disposed between the external connector and the internal connector. The barrier structure includes a dielectric material having a first surface and a second surface opposite the first surface, a first plurality of connecting pads disposed on the first surface, a second plurality of connecting pads disposed on the second surface, and a plurality of conductors embedded in the dielectric material. Each conductor has a first end adjacent a corresponding connecting pad of the first plurality of connecting pads and a second end adjacent a corresponding connecting pad of the second plurality of connecting pads. The barrier structure further includes a first ground layer embedded in the dielectric material, and the first ground layer is coplanar with the first end of each conductor. The barrier structure further includes a second ground layer embedded in the dielectric material, and the second ground layer is coplanar with the second end of each conductor. The barrier structure further includes one or more layers embedded in the dielectric material, and the one or more layers are located between the first and second ground layers.

In another embodiment, a hard disk drive (HDD) includes one or more magnetic media, one or more sliders, one or more magnetic head assemblies, and a hermetic electrical connector. The hermetic electrical connector includes an external connector, an internal connector, and a barrier structure disposed between the external connector and the internal connector. The barrier structure includes a dielectric material (having a first surface and a second surface opposite the first surface) and one or more layers embedded in the dielectric material. The one or more layers each includes a plurality of openings. The barrier structure further includes a plurality of conductors embedded in the dielectric material. Each conductor extends through a corresponding opening of the plurality of openings of each layer.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments in any field involving magnetic sensors.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments. However, it should be understood that the disclosure is not limited to specific described embodiments. Instead, any combination of the following features and elements, whether related to different embodiments or not, is contemplated to implement and practice the claimed subject matter. Furthermore, although embodiments described herein may achieve advantages over other possible solutions and/or over the prior art, whether or not a particular advantage is achieved by a given embodiment is not limiting of the claimed subject matter. Thus, the following aspects, features, embodiments and advantages are merely illustrative and are not considered elements or limitations of the appended claims except where explicitly recited in a claim(s).

Embodiments disclosed herein generally relate to hermetic electrical connectors used in hard disk drives (HDDs). The hermetic electrical connector includes a barrier structure having a first plurality of connecting pads disposed on a first surface of the barrier structure and a second plurality of connecting pads disposed on a second surface of the barrier structure opposite the first surface. A plurality of conductors is disposed within the barrier structure, and each conductor is coupled to a connecting pad of the first plurality of connecting pads and a corresponding connecting pad of the second plurality of connecting pads. The barrier structure further includes a dielectric material between the first and second surfaces, and one or more layers embedded in the dielectric material. The addition of the layers helps choke the helium gas flow, thus improving sealing of the electrical connector while maintaining high-speed electrical transmission.

Figure 1A:
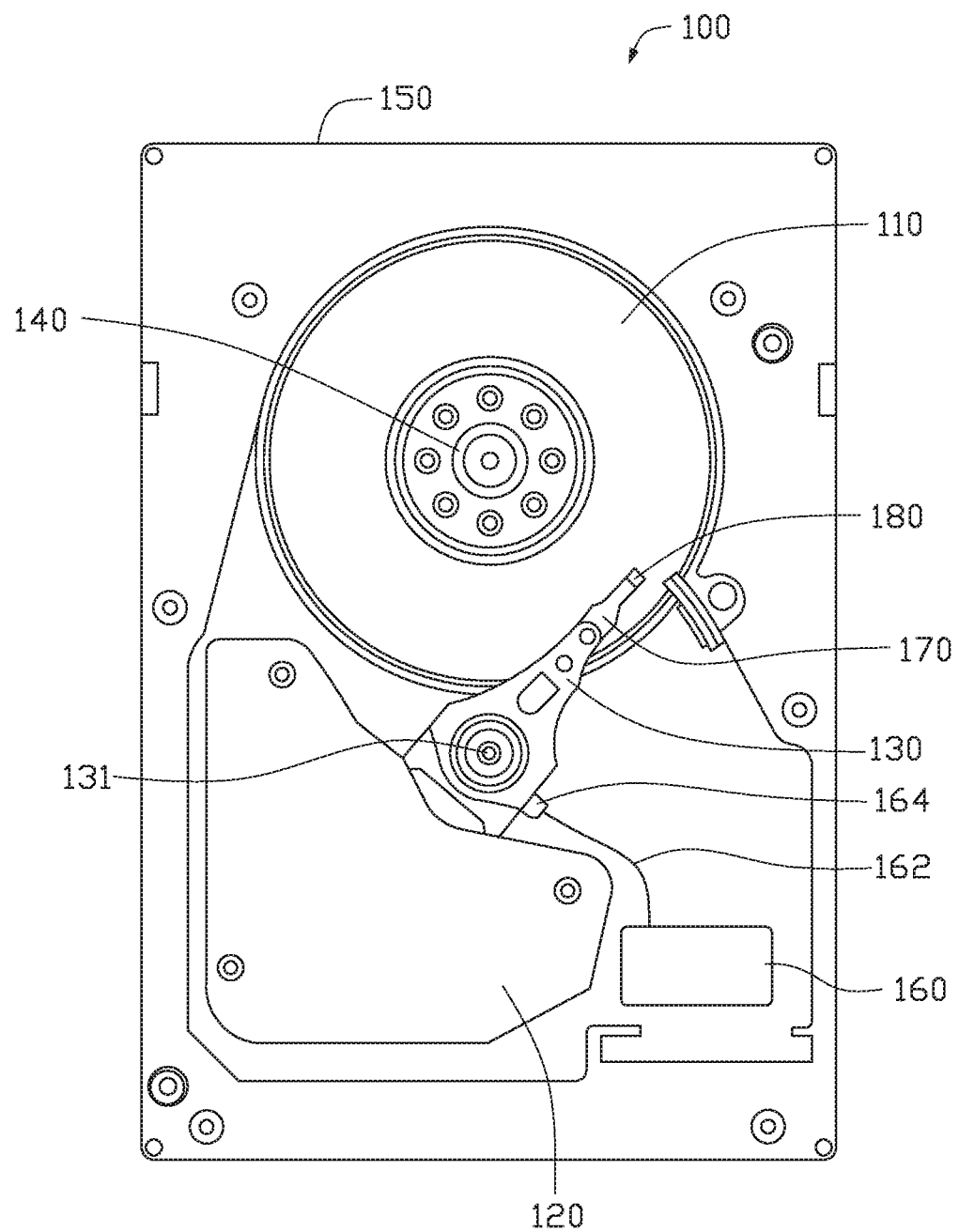
FIGS. 1A and 1B schematically illustrate an HDD according to embodiments described herein.

FIG. 1A illustrates a schematic front view of an exemplary hard disk drive (HDD) 100 according to an embodiment described herein. As illustrated, HDD 100 may include one or more magnetic media 110, such as magnetic disks, actuator means 120, actuator arms 130 associated with each of the magnetic media, and spindle motor 140 affixed in a chassis 150. The one or more magnetic media 110 may be arranged vertically as illustrated in FIG. 1A. Moreover, the one or more magnetic media may be coupled with the spindle motor 140.

One or more sliders 170 may be positioned near the magnetic media 110, each slider 170 supporting one or more magnetic head assemblies 180. Magnetic media 110 may include any suitable patterns of data tracks, such as annular patterns of concentric data tracks on both the top and bottom surfaces of each magnetic medium 110. As the magnetic medium rotates, the slider 170 moves radially in and out over the top and/or bottom surface so that the magnetic head assembly 180 may access different tracks of the magnetic medium 110 where desired data are written. Each slider 170 is attached to an actuator arm 130 via a suspension arm (not shown). The actuator arm 130 may be configured to swivel around actuator axis 131 to place the magnetic head assemblies 180 on a particular data track. The suspension arm provides a slight spring force which biases the slider 170 towards the magnetic media 110. Each actuator arm 130 is attached to the actuator means 120. The actuator means 120 as shown in FIG. 1A may be a voice coil motor (VCM). The VCM comprises a coil movable within a fixed magnetic field, the direction and speed of the coil movements being controlled by the motor current signals supplied by a control unit (not shown).

During operation of the HDD 100, the rotation of the magnetic media 110 generates an air bearing between each slider 170 and magnetic media 110 which exerts an upward force or lift on the slider 170. The air bearing thus counterbalances the slight spring force of the suspension arm and supports slider 170 off and slightly above the media 110 surface by a small, substantially constant spacing during normal operation. The term "air" used herein may include any suitable gas. In one embodiment, the HDD 100 is filled with helium gas.

The HDD 100 may further include a hermetic electrical connector 160 that is coupled to an arm-electronics module 164 via an interconnect cable 162, as shown in FIG. 1A. The hermetic electrical connector 160 may be used to electrically connect the interior components of the HDD 100 with an electronic device, such as a computer.

The above description of a typical magnetic media storage system and the accompanying illustration of FIG. 1A are for representative purposes only. It should be apparent that media storage systems may contain a large number of media and actuators, and each actuator may support a number of sliders.

Figure 1B:
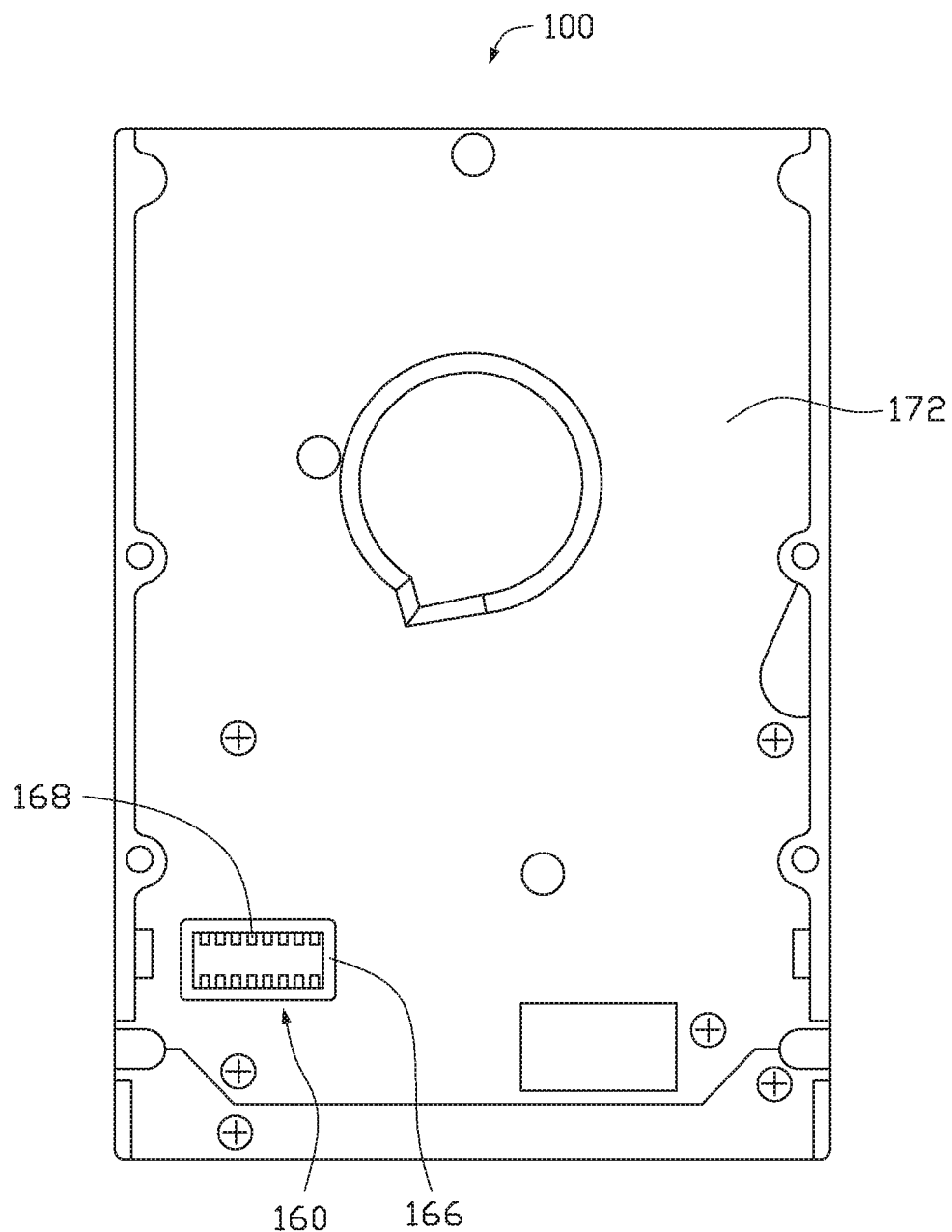

FIG. 1B is a schematic back view of the HDD 100 with a back cover 172 according to an embodiment described herein. As shown in FIG. 1B, the HDD 100 may include the hermetic electrical connector 160, and the hermetic electrical connector 160 may include an external connector 166 formed through the back cover 172. Again, the external connector 166 may be used to electrically connect the HDD 100 with any suitable electronic device, such as a computer. The external connector 166 of the hermetic electrical connector 160 may include a plurality of pins 168 for establishing electrical connection with the electronic device. In one embodiment, there are 28 pins, but it is to be understood that more or fewer pins may be present. In order to prevent gas, such as helium gas, from leaking out of the HDD 100, the hermetic electrical connector 160 may hermetically seal the HDD 100 without sacrificing high-speed electrical transmission.

Figure 2:
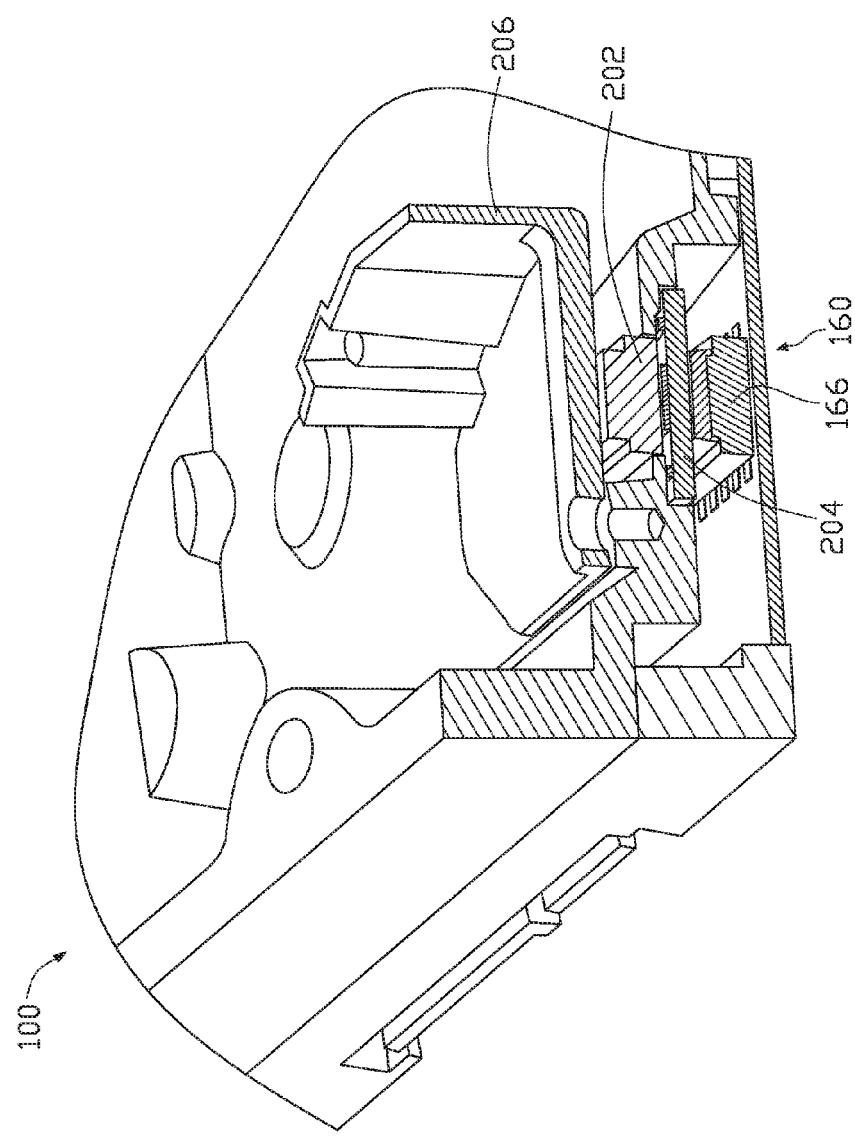
FIG. 2 is a perspective, cross-sectional view of a portion of the HDD according to embodiments described herein.

FIG. 2 is a cross-sectional perspective view of a portion of the HDD 100 according to embodiments described herein. As shown in FIG. 2, the HDD 100 includes the hermetic electrical connector 160 coupled to a bracket 206. In one embodiment, the bracket 206 is coupled to the chassis 150 and is not part of the chassis 150. In another embodiment, the bracket 206 is part of the chassis 150. The hermetic electrical connector 160 may include the external connector 166 for electrically connecting with an electronic device, an internal connector 202 for electrically connecting with the internal components of the HDD 100, and a barrier structure 204 disposed between the external connector 166 and the internal connector 202. The barrier structure 204 may be disposed at the center (with respect to a thickness of the hermetic electrical connector 160) of the hermetic electrical connector 160 and may be independent of the circuit layers in the internal connector 202 and the external connector 166. As a result, it is possible to suppress the influence of the capacitance of the hermetic electrical connector 160. In addition, the independent and centrally-located barrier structure 204 (with respect to the hermetic electrical connector 160) also ensures the consistency of the characteristic impedance, which ensures the high-speed electrical transmission through the hermetic electrical connector 160.

Figure 3A:
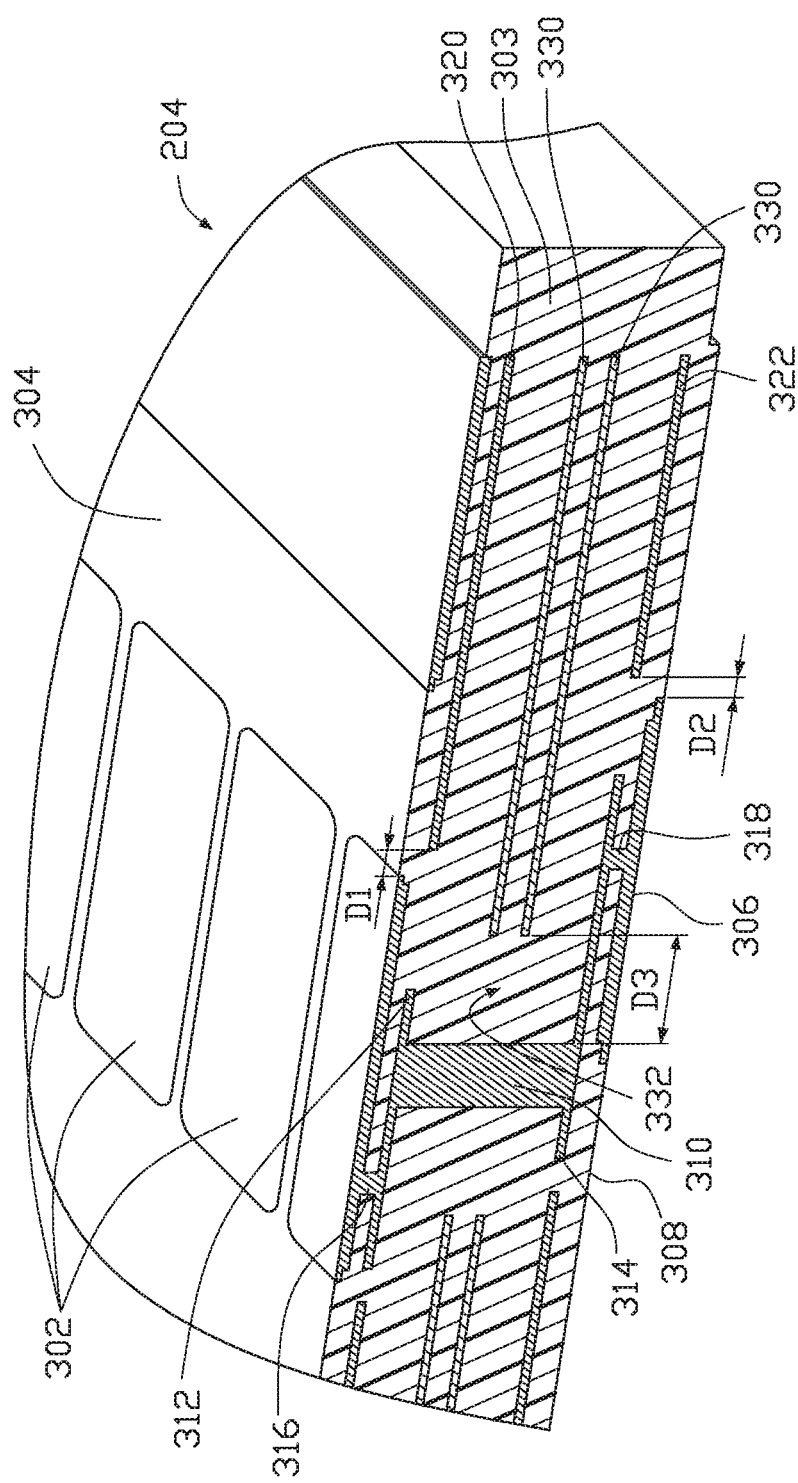
FIGS. 3A-3B are perspective, cross-sectional views of a barrier structure according to embodiments described herein.
Figure 3B:
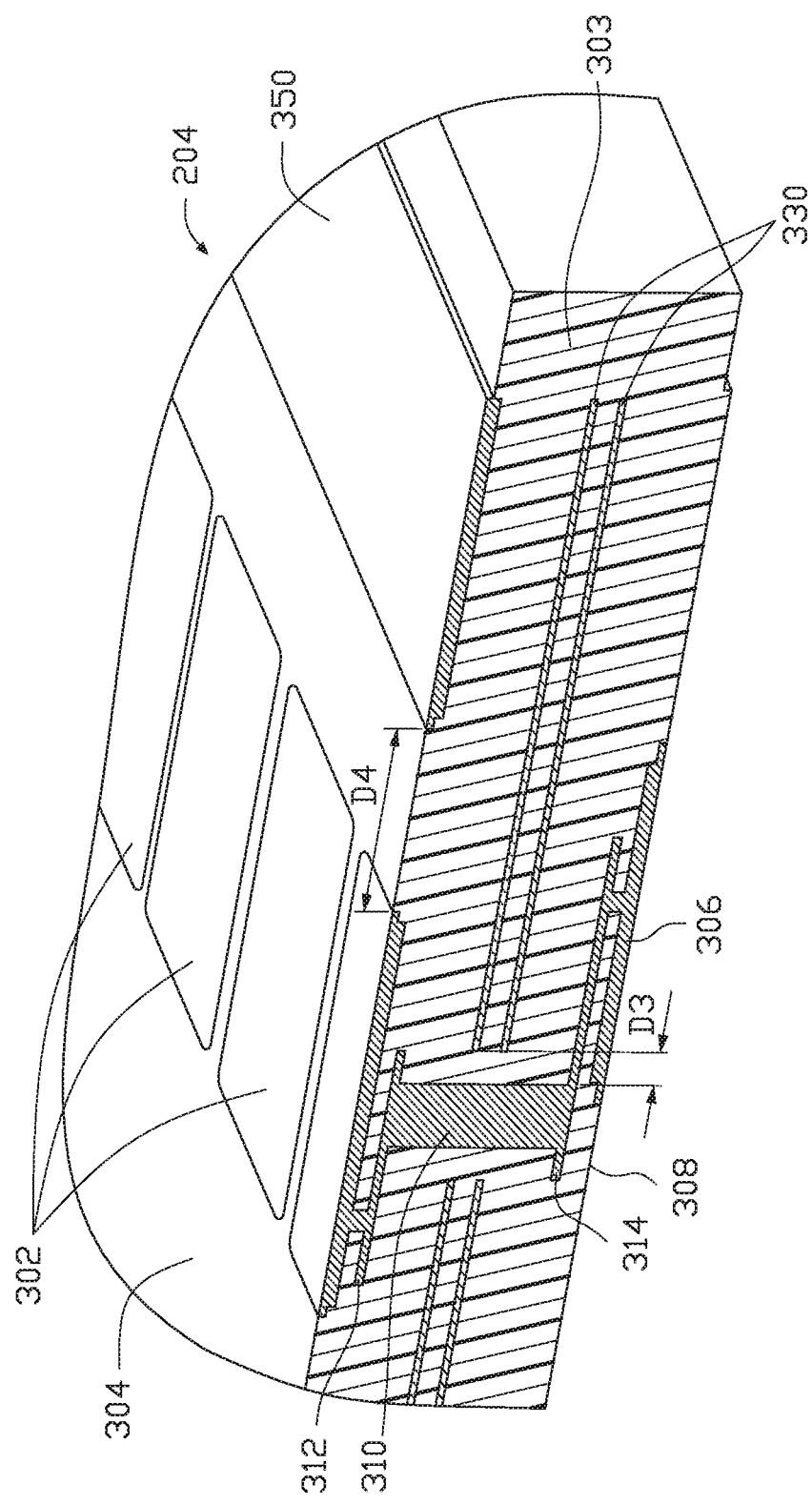

FIGS. 3A-3B are cross-sectional perspective views of the barrier structure 204 according to embodiments described herein. As shown in FIG. 3A, the barrier structure 204 includes a dielectric material 303 having a first surface 304 and a second surface 308 opposite the first surface 304. The dielectric material may be any suitable dielectric material, such as phenolic paper, epoxy paper, glass composite, glass epoxy, or polymer. The dielectric material 303 may be a multilayer structure. A first plurality of connecting pads 302 may be disposed on the first surface 304, and a second plurality of connecting pads 306 may be disposed on the second surface 308. The first surface 304 may be coupled to the external connector 166 (FIG. 1B), and the first plurality of connecting pads 302 may be electrically connected to the plurality of pins 168 (FIG. 1B). Similarly, the second surface 308 may be coupled to the internal connector 202, and the second plurality of connecting pads 306 may be electrically connected to a plurality of pins (not shown) disposed on the internal connector 202.

The first plurality of connecting pads 302 and the second plurality of connecting pads 306 may be electrically connected by a plurality of conductors 310, as shown in FIG. 3A. Each conductor 310 may include a first end 312 adjacent a corresponding connecting pad 302 of the first plurality of connecting pads 302, and the first end 312 may be electrically connected to the corresponding connecting pad 302 by a conductor 316. Each conductor 310 may also include a second end 314 adjacent a corresponding connecting pad 306 of the second plurality of connecting pads 306, and the second end 314 may be electrically connected to the corresponding connecting pad 306 by a conductor 318. The plurality of conductors 310 and the conductors 316, 318 may be embedded in the dielectric material 303 and may be made of an electrically conductive material, such as copper, conductive polymer, or nickel. The first plurality of connecting pads 302 and the second plurality of connecting pads 306 may be offset (i.e., not aligned).

The barrier structure 204 may also include ground layers 320, 322, as shown in FIG. 3A. The ground layers 320, 322 may be made of an electrically conductive material, such as copper, conductive polymer, or nickel. In one embodiment, the ground layer 320 is level, or coplanar, with the first end 312 of the plurality of conductors 310, and the ground layer 322 is level, or coplanar, with the second end 314 of the plurality of conductors 310. A distance D1 may be between the ground layer 320 and the connecting pad 302, and a distance D2 may be between the ground layer 322 and the connecting pad 306. The distances D1 and D2 ensure that the connecting pad 302, 306 are not overlapping with the ground layer 320, 322, respectively, in order to minimize parasitic capacitance. To further minimize parasitic capacitance, the distances D1 and/or D2 may be greater than a width of a signal line. Parasitic capacitance is an unwanted capacitance that exists between parts of an electronic component because of the parts' proximity to each other. By increasing the distance between the parts, such as between the ends 312, 314 of the conductor 310 and the ground layers 320, 322, respectively, parasitic capacitance is reduced.

The dielectric material 303 may be porous with respective to small molecules (such as helium gas), so helium gas inside the HDD 100 may diffuse or leak out of the dielectric material 303. One or more layers 330 may be embedded in the dielectric material 303 in order to reduce the gradient of partial pressure even if the molecules are small. The layers 330 may be made of a metal or a material having a permeability of about under the 1.0e-14 g/cm*Torr so that small molecules such as helium cannot diffuse through. The one or more layers 330 may be made of aluminum, copper, ceramic, quartz, Vycor®, Pyrex® 7740 borosilicate glass, Corning 1720 aluminosilicate glass, neoprene, butyl rubber, or nitrile rubber (Buna-N). The one or more layers 330 may be centrally-located within the dielectric material 303. In other words, the distance between the layer 330 closest to the first surface 304 and the first surface 304 may be the same as the distance between the layer 330 closest to the second surface 308 and the second surface 308. In one embodiment, there are two layers 330 disposed between the ground layers 320, 322, as shown in FIG. 3A, but it is to be understood that more or fewer layers 330 may be present. In one embodiment, one layer 330 is utilized instead of two layers 330. The two layers 330 may be aligned and parallel. A plurality of openings 332 may be formed in each layer 330, and each conductor 310 of the plurality of conductors 310 may extend through openings 332 of the layers 330. A distance D3 may be between each layer 330 and each conductor 310. The distance D3 may be smaller than the distances D1 and D2. In one embodiment, the distance D3 may be about 150 microns or more, such as about 200 microns or 500 microns. The smaller distance D3 reduces the diffusion rate of helium gas through the dielectric material 303 because helium gas cannot diffuse through the one or more layers 330. However, the distance D3 is not small enough to increase parasitic capacitance. The distance D3 between the layer 330 and the conductor 310 is small enough to improve air tightness of the barrier structure 204 but large enough not to increase parasitic capacitance.

FIG. 3B is a cross-sectional perspective view of the barrier structure 204 according to another embodiment described herein. As shown in FIG. 3B, the ground layers 320, 322 may be removed in order to further reduce parasitic capacitance. Portions of the dielectric material 303 may be exposed on the first surface 304, and the exposed portion may have a width D4. The exposed portion may be between the plurality of connecting pads 302 and a metal pad 350 or between adjacent rows of connecting pads 302. The distance D3, which is between each layer 330 and the conductor 310, may be smaller than the width D4. In one embodiment, the distance D3 is about 150 microns. In another embodiment, the distance D3 is about 200 microns. Similarly, having a smaller distance D3 compared to D4 helps choke the flow of helium gas in the dielectric material 303, which decreases leak rate. In one embodiment, the leak rate of the HDD 100 including the hermetic electrical connector 160 having the barrier structure 204 is about 50% less than that of an HDD having a conventional hermetic electrical connector.

Figure 4:
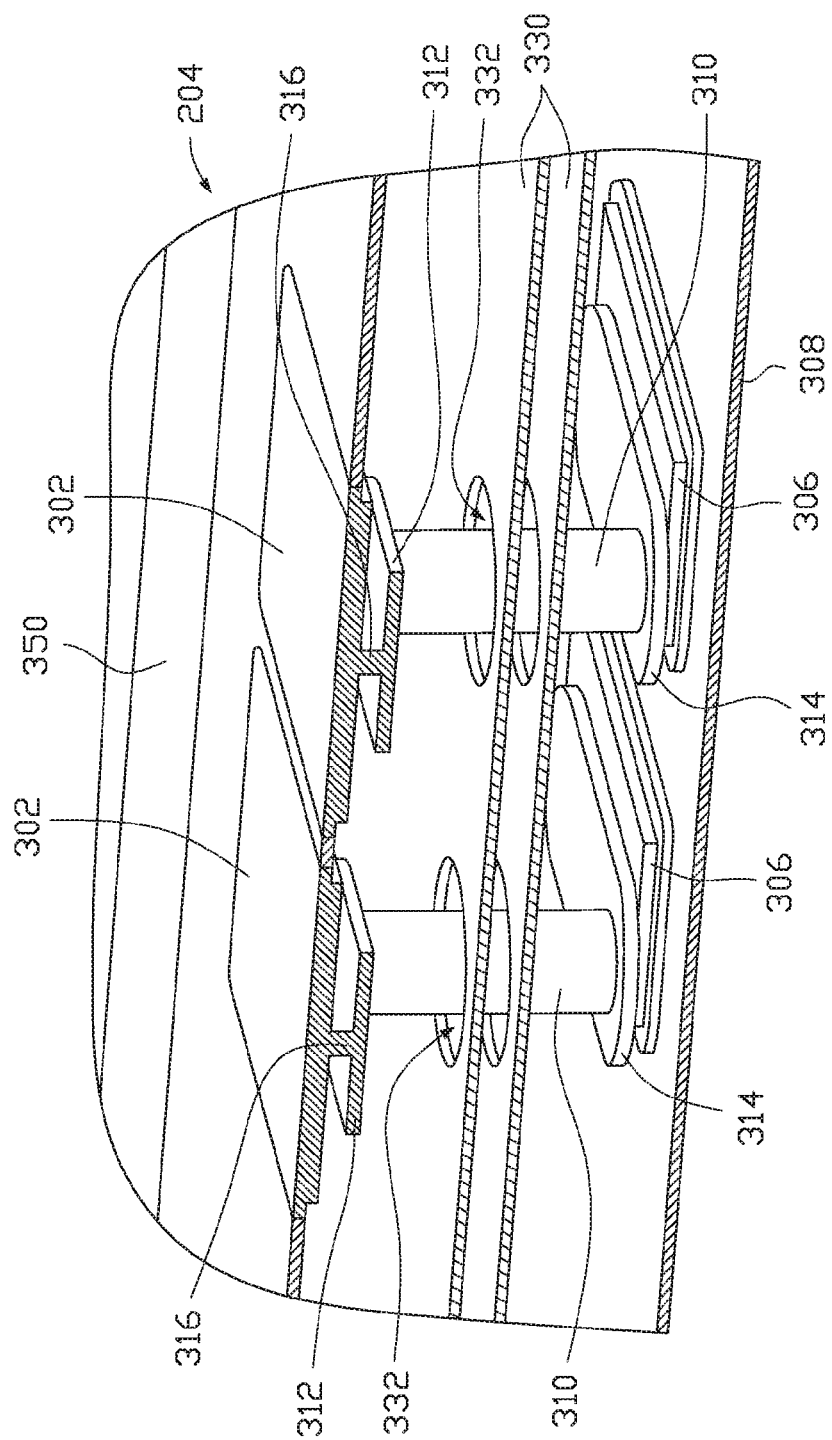
FIG. 4 is a perspective, cross-sectional view of the barrier structure according to embodiments described herein.

FIG. 4 is a cross-sectional perspective view of the barrier structure 204 according to embodiments described herein. In order to better illustrate, the dielectric material 303 is omitted in FIG. 4. As shown in FIG. 4, each conductor 310 extends through the one or more layers 330. The first end 312 of each conductor 310 is electrically connected to a corresponding connecting pad 302 via the conductor 316. Each conductor may include a cylindrical body having a cross-sectional diameter of about 300 microns. Each opening 332 in each layer 330 may have a diameter equal to the diameter of each conductor 310 plus two times the distance D3 (FIG. 3A). In one embodiment, the diameter of each opening 332 is equal to the diameter of the conductor 310 plus 300 microns. In another embodiment, the diameter of each opening 332 is equal to the diameter of the conductor 310 plus 400 microns. The openings 332 may be circular and the cylindrical body of each conductor 310 may be centrally-located within each opening 332. In other words, each conductor 310 and the corresponding opening 332 may be concentric. Again, the only places helium gas can leak or diffuse through within the dielectric material 303 are the plurality of openings 332. Because of the relatively small distance between the conductor 310 located within the opening 332 and the layer 330, helium gas flow within the dielectric material 303 is choked, leading to reduced helium gas leaking out of the HDD 100.

In summary, a hermetic electrical connector used in an HDD is disclosed. The hermetic electrical connector may include a barrier structure having a dielectric material and one or more layers embedded in the dielectric material. The one or more layers help prevent or reduce small molecules, such as helium gas, from diffusing or leaking through the dielectric material. Additionally, a plurality of openings may be formed in each layer, and a conductor may extend through each opening. By having a specific spacing between each conductor and the layer, parasitic capacitance is reduced.

While the foregoing is directed to embodiments of the disclosure, other and further embodiments may be devised without departing from the basic scope thereof, and the scope thereof is determined by the claims that follow.

What is claimed is:

1. A hermetic electrical connector, comprising:
an external connector;
an internal connector; and
a barrier structure disposed between the external connector and the internal connector, wherein the barrier structure comprises:
  a dielectric material having a first surface and a second surface opposite the first surface;
  one or more layers embedded in the dielectric material, wherein the one or more layers each includes a plurality of openings; and
  a plurality of conductors embedded in the dielectric material, wherein each conductor extends through a corresponding opening of the plurality of openings of each layer.

2. The hermetic electrical connector of claim 1, wherein the barrier structure is centrally-located within the hermetic electrical connector.

3. The hermetic electrical connector of claim 1, wherein a layer of the one or more layers comprises aluminum, copper, ceramic, quartz, borosilicate glass, aluminosilicate glass, neoprene, butyl rubber, or nitrile rubber (Buna-N).

4. The hermetic electrical connector of claim 1, wherein the one or more layers comprise two layers.

5. The hermetic electrical connector of claim 1, wherein the one or more layers comprise one layer.

6. The hermetic electrical connector of claim 1, wherein a conductor of the plurality of conductors is concentric with a corresponding opening of the plurality of openings, and the conductor is spaced apart from a layer of the one or more layers.

7. The hermetic electrical connector of claim 6, wherein the conductor is spaced apart from the layer by about at least 150 microns.

8. The hermetic electrical connector of claim 6, wherein the conductor is spaced apart from the layer by about 150 microns to about 500 microns.

9. The hermetic electrical connector of claim 1, wherein an opening of the plurality of openings has a diameter of about at least 600 microns.

10. The hermetic electrical connector of claim 1, wherein an opening of the plurality of openings has a diameter equal to a diameter of a conductor of the plurality of conductors plus at least 300 microns.

11. A hermetic electrical connector, comprising:
an external connector;
an internal connector; and
a barrier structure disposed between the external connector and the internal connector, wherein the barrier structure comprises:
  a dielectric material having a first surface and a second surface opposite the first surface;
  a first plurality of connecting pads disposed on the first surface;
  a second plurality of connecting pads disposed on the second surface;
  a plurality of conductors embedded in the dielectric material, wherein each conductor has a first end adjacent a corresponding connecting pad of the first plurality of connecting pads and a second end adjacent a corresponding connecting pad of the second plurality of connecting pads;
  a first ground layer embedded in the dielectric material, wherein the first ground layer is coplanar with the first end of each conductor;
  a second ground layer embedded in the dielectric material, wherein the second ground layer is coplanar with the second end of each conductor; and
  one or more layers embedded in the dielectric material, wherein the one or more layers are located between the first and second ground layers.

12. The hermetic electrical connector of claim 11, wherein a layer of the one or more layers comprises aluminum, copper, ceramic, quartz, borosilicate glass, aluminosilicate glass, neoprene, butyl rubber, or nitrile rubber (Buna-N).

13. The hermetic electrical connector of claim 11, wherein the one or more layers each includes a plurality of openings.

14. The hermetic electrical connector of claim 13, wherein a conductor of the plurality of conductors is concentric with a corresponding opening of the plurality of openings, and the conductor is spaced apart from a layer of the one or more layers.

15. The hermetic electrical connector of claim 14, wherein the conductor is spaced apart from the layer by about at least 150 microns.

16. The hermetic electrical connector of claim 14, wherein the conductor is spaced apart from the layer by about 150 microns to about 500 microns.

17. A hard disk drive, comprising:
one or more magnetic media;
one or more sliders;
one or more magnetic head assemblies; and
a hermetic electrical connector, comprising:
  an external connector;
  an internal connector; and
  a barrier structure disposed between the external connector and the internal connector, wherein the barrier structure comprises:
    a dielectric material having a first surface and a second surface opposite the first surface;

one or more layers embedded in the dielectric material, wherein the one or more layers each includes a plurality of openings; and a plurality of conductors embedded in the dielectric material, wherein each conductor extends through a corresponding opening of the plurality of openings of each layer.

18. The hard disk drive of claim 17, wherein a layer of the one or more layers comprises aluminum, copper, ceramic, quartz, borosilicate glass, aluminosilicate glass, neoprene, butyl rubber, or nitrile rubber (Buna-N).

19. The hard disk drive of claim 17, wherein an opening of the plurality of openings has a diameter equal to a diameter of a conductor of the plurality of conductors plus at least 300 microns.

20. The hard disk drive of claim 17, wherein an opening of the plurality of openings has a diameter equal to a diameter of a conductor of the plurality of conductors plus about 300 microns to about 1000 microns.

* * * * *